United States Patent [19]

Hunt et al.

[11] Patent Number: 5,748,021
[45] Date of Patent: May 5, 1998

[54] IMPROVED SENSE AMPLIFIER DESIGN WITH DYNAMIC RECOVERY

[75] Inventors: Jeffery Scott Hunt, Ackerman; Satish C. Saripella, Starkville, both of Miss.

[73] Assignee: Cypress Semiconductor Corporation, San Jose, Calif.

[21] Appl. No.: 754,177

[22] Filed: Nov. 21, 1996

[51] Int. Cl.⁶ .................... H03K 5/08; H03K 17/16
[52] U.S. Cl. ............... 327/312; 327/310; 327/384
[58] Field of Search .................... 327/310, 312, 327/379, 384, 385, 34, 51, 551, 362; 365/185.16, 185.21

[56] References Cited

U.S. PATENT DOCUMENTS

| | | |
|---|---|---|
| 5,065,054 | 11/1991 | Nguyen et al. ........................... 327/34 |
| 5,151,612 | 9/1992 | Ishikawa ................................. 327/34 |
| 5,155,380 | 10/1992 | Hwang et al. ........................... 327/34 |
| 5,276,370 | 1/1994 | Nishiura et al. ........................ 327/310 |
| 5,563,527 | 10/1996 | Diba ...................................... 327/51 |
| 5,666,310 | 9/1997 | Yu et al. ............................... 365/185.21 |

*Primary Examiner*—Toan Tran
*Attorney, Agent, or Firm*—Bliss McGlynn, P.C.

[57] ABSTRACT

The present invention concerns a method and apparatus that generally prevents an output glitch in a sense amplifier during a transition from a strong zero to a weak zero. When multiple cells are turned on, a virtual ground node is raised high due to the current flowing through the virtual ground device. A recover node is generally held close to the read product term line RPT. When a transition from a strong zero occurs, the recover node swings to VCC and provides conductance on the virtual ground node which generally eliminates the glitch.

20 Claims, 3 Drawing Sheets

IMPROVED SENSE AMPLIFIER DESIGN WITH DYNAMIC RECOVERY

FIELD OF THE INVENTION

The present invention relates to sense amplifiers generally and, more particularly, to a sense amplifier design that eliminates false triggering during a transition between a strong zero and a weak zero condition.

BACKGROUND OF THE INVENTION

One implementation of a high speed sense amplifier used in a programmable logic device (PLD) application involves the use of a virtual ground device to prevent a read product term line (RPT) from swinging too low. The virtual ground device results in very fast access times. However, the use of a virtual ground device creates a situation during a transition from a "strong" zero to a "weak" zero that may create a glitch in the output of the sense amplifier. A weak zero occurs when a single memory cell pulls down on the RPT line. A strong zero results when multiple memory cells pull down on the RPT line. A glitch during the transition between a strong zero and a weak zero is undesirable during normal operation of the sense amplifier. Such a glitch can be particularly troublesome in applications using state machine implementations of the PLD.

Referring to FIG. 1, a previous approach circuit 10 is shown implementing a sense amplifier 12 with a programmable element block 14. The sense amplifier 12 generally comprises a first stage 16 and a second stage 18. The first stage 16 generally comprises a pullup transistor 20, a pulldown transistor 22, a transistor 24, a transistor 26 and a transistor 28. The pullup transistor 20 has a gate that receives a voltage VREF2. The pulldown transistor 22 has a gate that receives the read product term (RPT). The pullup transistor 20 and the pulldown transistor 22 are coupled together and have a node OUT1 that presents an output to the second stage 18. The RPT line is also connected to the programmable element block 14. The programmable element block 14 is also connected to a virtual ground line VGND. The virtual ground line VGND is connected to the drain of the transistor 28. A gate of the transistor 28 receives a reference voltage VREF1.

The programmable element block 14 comprises a number of memory cells 30a–30n. The transistor 24 is shown as a depletion mode NMOS device. If the memory devices 30a–30n are implemented as a floating avalanche metal oxide semiconductor (FAMOS) device operating in a programmable array logic (PAL) mode, the drain is limited to not more than one or two volts to prevent hot electron tunneling, which may corrupt the data stored. The limiting of the drain voltage to one or two volts generally prevents program disturb issues from arising. For high speed applications, large voltage swings on the read product term line RPT are undesirable. Large voltage swings create a delay in recovering the read product term line which is generally capacitive as a result of the connection of the various memory cells 30a–30n.

Referring to FIG. 2, the previous approach circuit 10 is shown in greater detail. The sense amplifier 12 is shown to further comprise a referenced inverter 32 and a buffer 34. The referenced inverter is shown comprising a transistor 36 and a transistor 38. The buffer 34 is shown comprising an inverter 40 and an inverter 42. The transistor 36 receives the voltage reference VREF2 and the transistor 38 receives an input from the node OUT1. The memory cell 30a is shown to be implemented as a transistor 44a and a transistor 46a. Similarly, the memory cell 30n is shown to be implemented as a transistor 44n and a transistor 46n.

The transistor 28 is shown to be an NMOS device that develops a drain voltage based on the number of memory cells 30a–30n that are "on". The voltage developed raises the virtual ground VGND and therefore limits the read product term RPT from swinging too low when a multiple number of memory cells 30a–30n are turned "on". The transistor 26 generally clamps the read product term line RPT from going to high when none of the memory cells 30a–30n are on. The transistor 22 works in combination with the transistor 24 to limit the low level of the read product term line RPT. The signal swing obtained on RPT is amplified by the first stage 16 and further by the referenced inverter 32 to drive the rail-to-rail signal transitions on the output SAOUT. The virtual ground VGND attempts to provide similar low level voltages on the read product term line RPT for both a weak zero and a strong zero condition.

During a transition from a strong zero to a weak zero condition, the node VGND has a large capacitive load and generally does not have adequate time to recover from a strong zero condition. This causes the transient condition to be registered as a logic "high" and switches the output SAOUT to a logic "high" condition for a short time. This momentary glitch creates problems in the overall functioning of the circuit 10. It is generally desirable for the output SAOUT to remain low even during a transition from a strong zero to a weak zero.

SUMMARY OF THE INVENTION

The present invention concerns a method and apparatus that generally prevents an output glitch in a sense amplifier during a transition from a strong zero to a weak zero. When multiple cells are turned on, a virtual ground node is raised high due to the current flowing through the virtual ground device. A recover node is generally held close to the read product term line RPT. When a transition from a strong zero occurs, the recover node swings to VCC and provides conductance on the virtual ground node which generally eliminates the glitch.

The objects, features and advantages of the present invention include providing an improved sense amplifier design that eliminates an output glitch during a transition between a strong zero and a weak zero and maintains a fast transition at the output.

BRIEF DESCRIPTION OF THE DRAWING

These and other objects, features and advantages of the present invention will be apparent from the following detailed description and the appended claims and drawings in which:

DETAILED DESCRIPTION OF THE PREFERRED EMBODIMENTS

Figure 3:
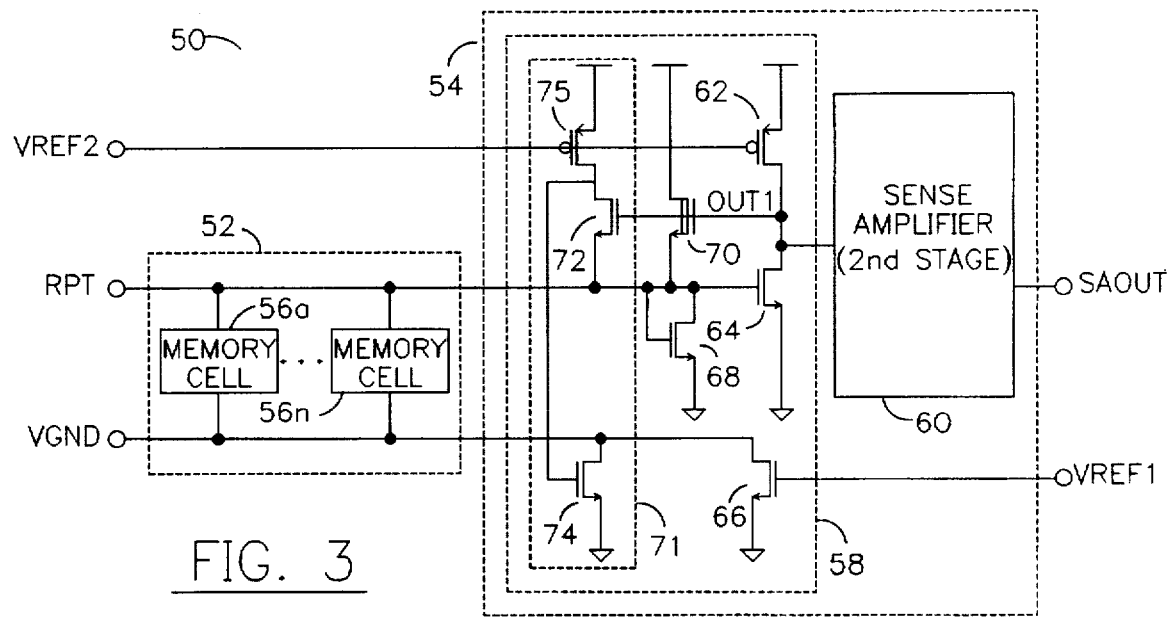
FIG. 3 is a block diagram of a preferred embodiment of the present invention.

Referring to FIG. 3, a block diagram of a circuit 50 is shown in accordance with a preferred embodiment of the present invention. The circuit 50 generally comprises a programmable element block 52 and a sense amplifier 54. The programmable element block 52 generally comprises a number of memory cells 56a–56n. The sense amplifier 54 generally comprises a first stage 58 and a second stage 60. The first stage 58 generally comprises a pullup transistor 62, a pulldown transistor 64, a transistor 66, a transistor 68, a transistor 70 and a recover section 71. The recover section 71 generally comprises a transistor 72, a transistor 74 and a transistor 75. The pullup transistor 62 has a gate that may receive a reference voltage VREF2. A gate of the pulldown transistor 64 is generally connected to a read product term line RPT.

The transistors 62 and 64 are generally coupled together with a node OUT1 presenting an output to the second stage 60. The transistor 68 is generally coupled between the read product term line RPT and ground. The read product term line RPT is generally coupled to the memory cells 56a–56n. The memory cells 56a–56n are also generally coupled to a virtual ground line VGND. The virtual ground VGND is also coupled to the drain of the transistor 66 and the drain of the transistor 74. The gate of the transistor 66 is generally coupled to a reference voltage VREF1. The transistor 70 generally has a source connected to the read product term line RPT and a gate connected to the output node OUT1. The transistor 72 generally has a source connected to the read product term line RPT, a gate connected to the output node OUT1 and a drain connected to the drain of the transistor 75 as well as to the gate of the transistor 74. The transistor 75 has a gate connected to the reference voltage VREF2. Alternatively, the gate of the transistor 75 may be coupled to the node OUT1. The sources of the transistors 62 and 75 and the drain of the transistor 70 are generally coupled to an input supply voltage. The reference voltages VREF1 and VREF2 are generally constant current supplies that may compensate for process variations.

Figure 4:
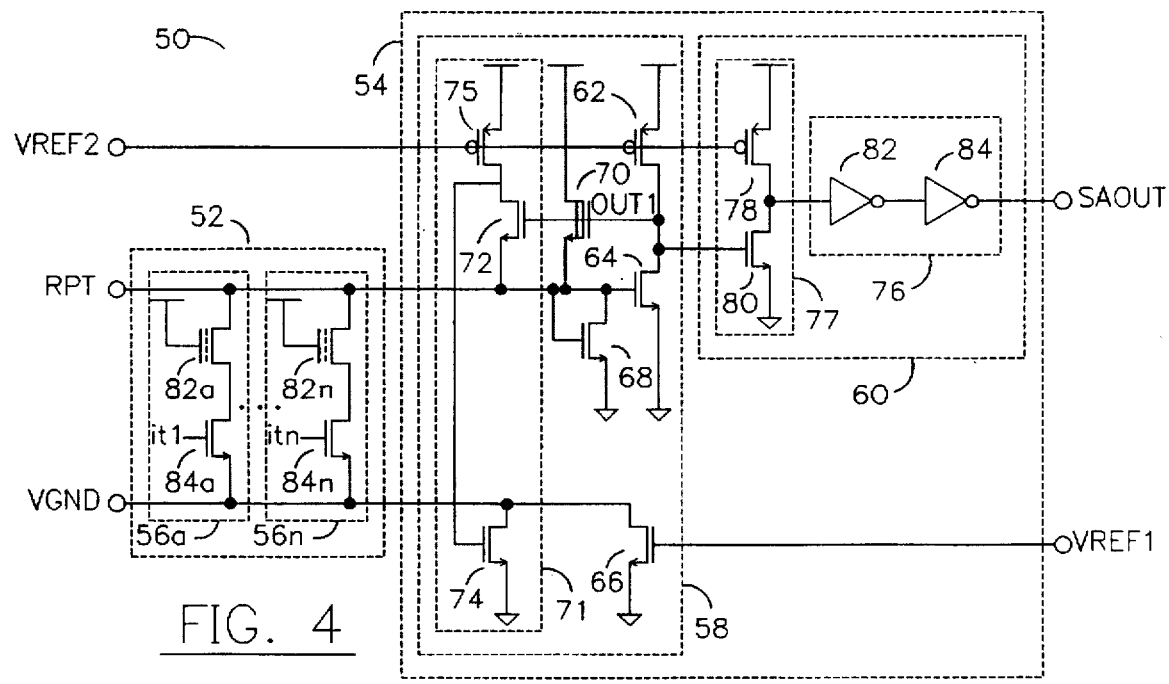
FIG. 4 is a more detailed circuit diagram of a preferred embodiment of the present invention.

Referring to FIG. 4, the circuit 50 is shown in greater detail. The second stage 60 generally comprises a buffer 76 and a referenced inverter 77. The referenced inverter 77 generally comprises a transistor 78 and a transistor 80. The buffer 76 generally comprises an inverter 82 and an inverter 84. The transistor 78 has a gate that generally receives the reference voltage VREF2. A gate of the transistor 80 generally receives a signal from the node OUT1. The transistors 78 and 80 are generally coupled together with a node B generally presenting a signal to the buffer 76. The buffer 76 generally presents a signal SAOUT.

The memory cell 56a generally comprises transistor 82a and a transistor 84a. Similarly, the memory cell 56n generally comprises a transistor 82n and a transistor 84n. A transistor 68 is generally coupled between the read product term line RPT and ground. The memory cells 56a–56n may be implemented as non-volatile memories such as Erasable Programmable Read Only Memories (EPROMs) or flash cells. However other non-volatile memories may be used to meet the design criteria of a particular application.

A strong zero situation occurs when multiple memory cells 56a–56n are turned "on" and the virtual ground line VGND is raised high due to the current flowing through the virtual ground device (i.e., the transistor 66). The pulldown transistor 64 generally experiences a reduction in gate drive. This reduction in gate drive causes the node OUT1 to swing high. During the transition from a strong zero to a weak zero, the node OUT1 essentially remains high in response to the gate to source drive on the pulldown transistor 64 remaining considerably weak. As a result, the output SAOUT remains low (i.e., is generally non-transitioning) and any glitches are generally eliminated.

The transistor 68 generally clamps the read product term line RPT from going too high when none of the memory cells 56a–56n are on. The transistor 70 and the transistor 68 generally work in combination to limit the high state of the read product term line RPT. The transistor 70 also works with the transistor 64 to limit the low level of the read product term line RPT. The transistor 70 generally limits the gate to source voltage of the transistor 64.

Since the node OUT1 is not at VCC, the transition recovery time is reduced, which decreases the delay to the output SAOUT and increases the overall speed of the circuit 50. It is generally desirable to minimize the swing of node OUT1, while maintaining gain in the referenced inverter 77 to achieve full rail swing on the output SAOUT, which increases the speed of the circuit 50.

If a single memory cell 56a–56n is on, an overall current in the range of approximately 50 microamps may flow through the cell. If many memory cells 56a–56n are on, 5 microamps may flow through each cell. When all memory cells except for one turn off, the amount of current through the single memory cell generally needs to transition from 5 microamps back to 50 microamps to keep the output SAOUT low. This is difficult to accomplish instantaneously and generally creates the glitch described in connection with FIG. 1 and FIG. 2.

The recover section 71 generally recovers the virtual ground line VGND as fast as possible. The recover section 71 helps the programmable element block 52 become stronger very fast. When the read product term line RPT is at a low level and the node OUT1 is at a high level, the recover section 71 generally turns on the transistor 72. The transistor 72 then pulls the node C down to approximately the level of the read product term line RPT. The level of the node C may be slightly higher than the read product term line RPT to keep the transistor 74 on, but in a weak state. During a transition from a strong zero to a weak zero, the read product term line RPT tries to transition high due to the glitch condition. Since the read product term line RPT is trying to glitch, it is going to transition higher. As a result, the node OUT1 is going to be pulling down lower. If the transistor 72 starts cutting off, the node C generally pulls the gate of the transistor 74 high. The transistor 74 becomes very strong and tries to pull the virtual ground node VGND down very quickly. The particular memory cell 56a–56n now has more gate to source voltage and generally becomes strong quickly. The read product term line RPT is recovered to a low state before having a chance to glitch at the node OUT1 (which generally causes the undesirable glitch in the output SAOUT). The recover section 71 generally detects when the read product term line RPT and the node OUT1 change states, since this generally represents when the glitch condition occurs. The recover section 71 generally uses the differential between the read product term line RPT and node OUT1 to shut off the transistor 72, which generally turns on the transistor 74. As a result, the virtual ground VGND is generally pulled down very fast which then recovers the memory cells 56a–56n.

The transistor 70 is shown generally as a depletion mode NMOS device. The transistors 64, 66, 68, 72, 74 and 80 are shown generally as NMOS enhancement devices. The transistors 62, 75 and 78 are shown generally as PMOS devices. Other devices may be substituted for the transistors 62, 64, 66, 68, 70, 72, 74, 75, 78 and 80 in accordance with the design criteria of a particular application.

Figure 1:
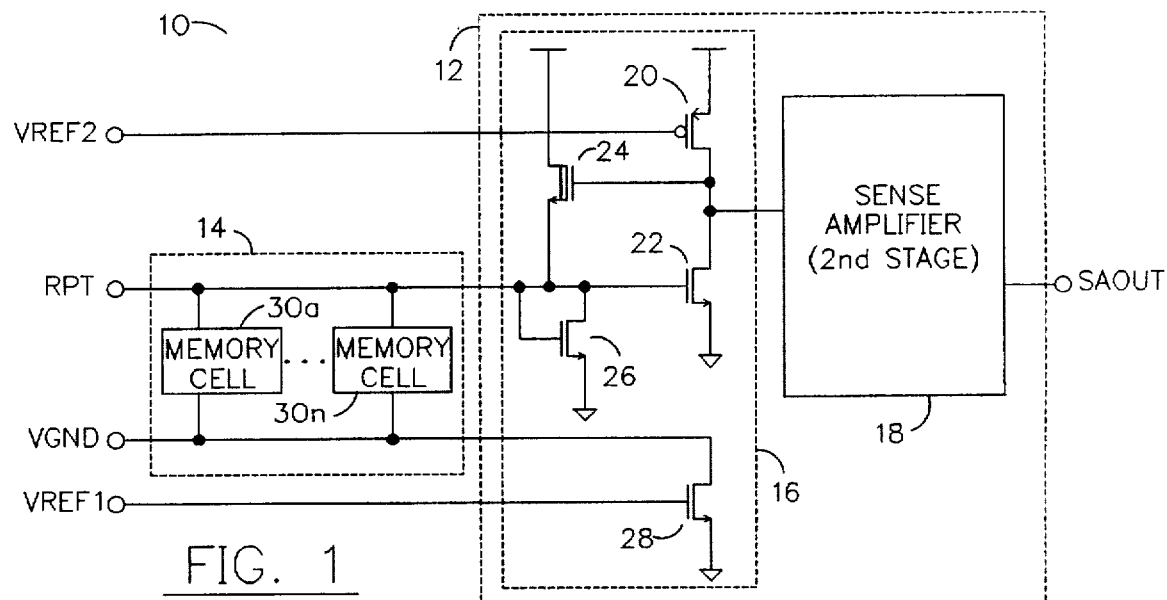
FIG. 1 is a block diagram of a previous approach circuit implementing a sense amplifier.
Figure 2:
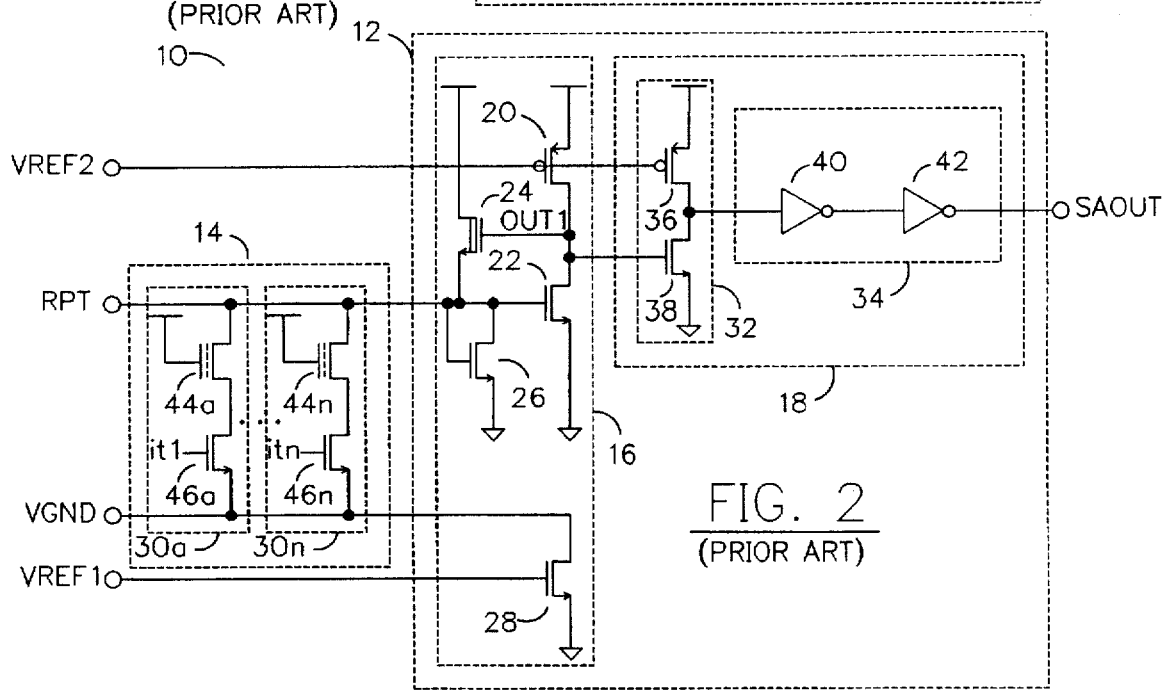
FIG. 2 is a more detailed circuit diagram of the previous approach sense amplifier shown in FIG. 1.
Figures 5A, 5B:
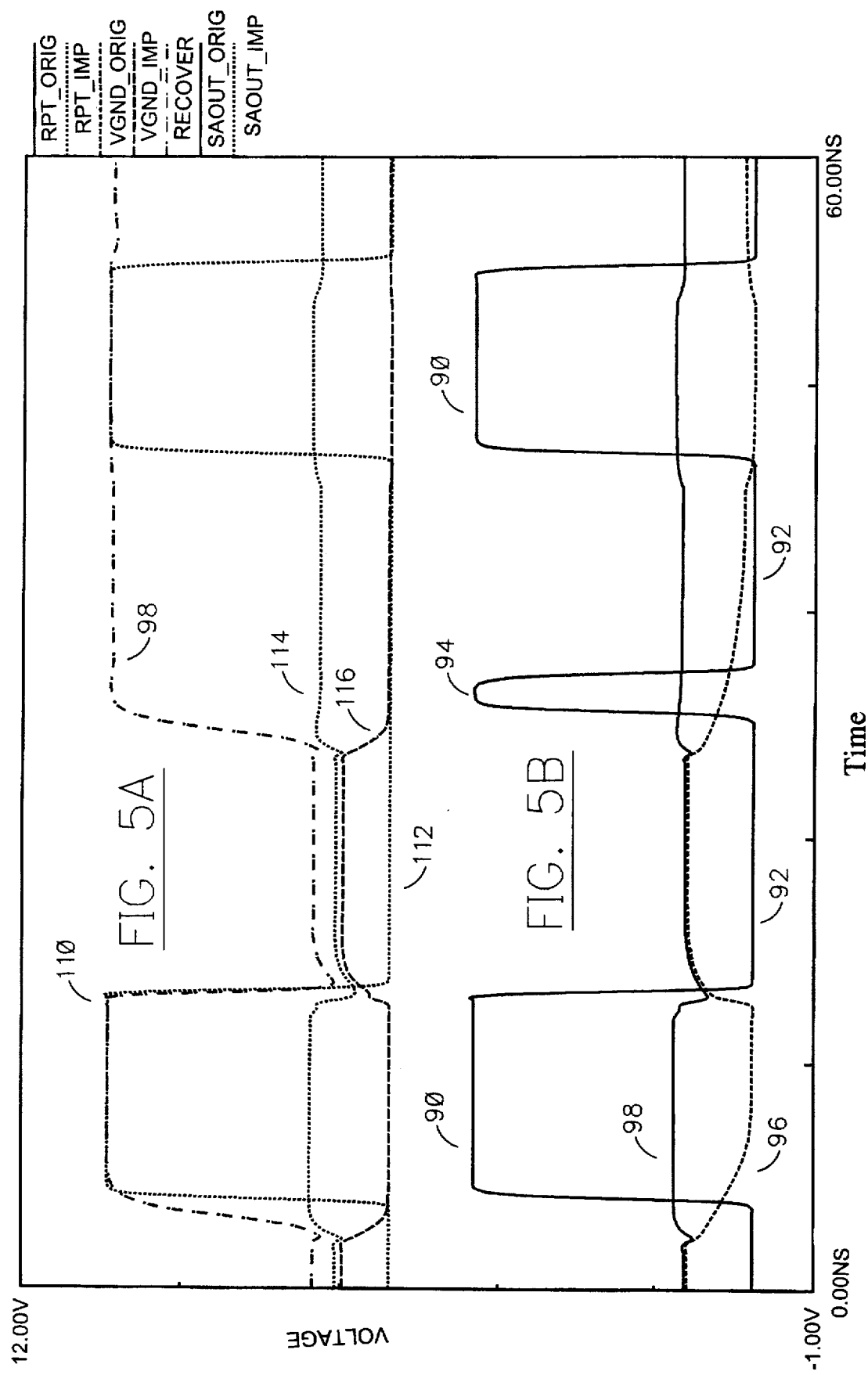
FIG. 5A is a plot of the RPT line, the node RECOVER, the virtual ground VGND, the RPT line and the output SAOUT of the present invention circuit of FIGS. 3 and 4.
FIG. 5B is a plot of the RPT line, the virtual ground VGND and the output SAOUT of the previous approach circuit of FIGS. 1 and 2.

Referring to FIG. 5A, a plot of the read product term line RPT, the output SAOUT the virtual ground VGND and the node RECOVER of the circuit of FIG. 3 and FIG. 4 is shown. Referring to 5B, a plot of the read product term line RPT, the virtual ground VGND and the output SAOUT of the circuit of FIGS. 1 and 2 is shown. FIGS. 5A and 5B graphically illustrate the comparison between the circuit 50 and the circuit 10. In FIG. 5B, the output SAOUT is generally high at a portion 90 and is low at a portion 92. The output SAOUT generally has a glitch 94. The virtual ground VGND is shown generally as a waveform 96. The RPT line is shown generally as a waveform 98.

Referring back to FIG. 5A, the output SAOUT is shown have a high portion 110 and a low portion 112. The RPT line is shown generally as a waveform 114. The virtual ground VGND is shown generally as a waveform 116. The node RECOVER is shown generally as a waveform 118. As a result, the output SAOUT generally remains low throughout the transition of the node RECOVER.

While the invention has been particularly shown and described with reference to the preferred embodiments thereof, it will be understood by those skilled in the art that various changes in form and details may be made without departing from the spirit and scope of the invention.

We claim:

1. A circuit having a read line, a ground line, a first reference line and a second reference line comprising:
   a first stage configured to generate a first output in response to said read line, said ground line and said first and second reference lines, wherein said first stage comprises: (i) a pullup section (ii) a pulldown section and (iii) a recover section for limiting a gate to source voltage of said pulldown section, wherein said pulldown section and said recover section provide a non-transitioning signal at the first output during a glitch condition on the ground line; and
   a second stage configured to provide a second output in response to said first output.

2. The circuit according to claim 1 wherein said glitch condition occurs during a transition between a strong zero and a weak zero.

3. The circuit according to claim 2 further comprising:
   a programmable logic device comprising a plurality of memory cells connected between said read line and said ground line.

4. The circuit according to claim 3 wherein said strong zero occurs when more than one of said memory cells are active and said weak zero occurs when only one of said memory cells is active.

5. The circuit according to claim 1 wherein said recover section further comprises:
   a first device coupled between the ground line and ground;
   a second device coupled to said read line and responsive to said first output; and
   a third device coupled to said second device and responsive to said second reference line.

6. The circuit according to claim 5 wherein said first and second devices comprise NMOS transistors and said third device comprises a PMOS transistor.

7. The circuit according to claim 1 wherein said read line comprises a read product term line.

8. The circuit according to claim 1 wherein said ground line comprises a virtual ground line.

9. The circuit according to claim 1 wherein said first and second reference lines comprise a first and second voltage reference line.

10. A circuit having a read line, a ground line, a first reference line and a second reference line comprising:
    means for generating a first output in response to said read line, said ground line and said first and second reference lines, wherein said generator means comprises: (i) pullup means (ii) pulldown means and (iii) recover means for limiting a gate to source voltage of said pulldown means, wherein said pulldown means and said recover means provide a non-transitioning signal at a first output during a glitch condition on said around line; and
    second means for generating a second output in response to said first output.

11. The circuit according to claim 10 wherein said glitch condition occurs during a transition between a strong zero and a weak zero.

12. The circuit according to claim 11 further comprising:
    logic means comprising a plurality of memory cells coupled between said read line and said ground line.

13. The circuit according to claim 12 wherein said strong zero occurs when more than one of said memory cells are active and said weak zero occurs when only one of said memory cells is active.

14. The circuit according to claim 10 wherein said recover means further comprising:
    first device coupled between the ground line and ground;
    a second device coupled to said read line and responsive to said first output; and
    a third device coupled to said second device and responsive to said second reference line.

15. The circuit according to claim 14 wherein said first and second devices comprise NMOS transistors and said third device comprises a PMOS transistor.

16. The circuit according to claim 10 wherein said read line comprises a read product term line.

17. The circuit according to claim 10 wherein said ground line comprises a virtual ground line.

18. The circuit according to claim 10 wherein said first and second reference lines comprise a first and second voltage reference line.

19. A method for providing a non-transitioning signal during a glitch condition comprising:
    generating a first output in response to a read line, a ground line, a first reference line, a second reference line, a pullup section, a pulldown section and a recover section for limiting a gate to source voltage of said pulldown section; and
    generating a second output in response to said first output, wherein said second output comprises said non-transitioning signal during said glitch condition on said around line.

20. The method according to claim 19 further comprising:
    generating said first output in response to a plurality of memory cells connected between said read line and said ground line, wherein said glitch condition occurs during a transition between a strong zero and a weak zero, wherein said strong zero occurs when more than one of said memory cells are active and said weak zero occurs when only one of said memory cells is active.

* * * * *